United States Patent
Kondoh et al.

(10) Patent No.: US 7,615,832 B2
(45) Date of Patent: Nov. 10, 2009

(54) PHYSICAL QUANTITY SENSOR, METHOD FOR MANUFACTURING THE SAME, AND RESIN FILM FOR BONDING SEMICONDUCTOR CHIP AND CIRCUIT CHIP

(75) Inventors: Ichiharu Kondoh, Nagoya (JP); Ryuichiro Abe, Ichinomiya (JP); Akitoshi Yamanaka, Hekinan (JP); Yoshio Nakajima, Kariya (JP)

(73) Assignee: DENSO CORPORATION, Kariya (JP)

( * ) Notice: Subject to any disclaimer, the term of this patent is extended or adjusted under 35 U.S.C. 154(b) by 33 days.

(21) Appl. No.: 11/703,644

(22) Filed: Feb. 8, 2007

(65) Prior Publication Data

US 2007/0235825 A1 Oct. 11, 2007

(30) Foreign Application Priority Data

Mar. 24, 2006 (JP) ............................. 2006-082733

(51) Int. Cl.
*H01L 27/14* (2006.01)
(52) U.S. Cl. ................. 257/414; 257/717; 257/E27.122
(58) Field of Classification Search ................. 257/414, 257/777, E27.122
See application file for complete search history.

(56) References Cited

U.S. PATENT DOCUMENTS

| | | | |
|---|---|---|---|
| 6,204,556 B1 * | 3/2001 | Hakamata | 257/728 |
| 6,316,840 B1 * | 11/2001 | Otani | 257/787 |
| 6,522,015 B1 * | 2/2003 | Glenn et al. | 257/777 |
| 7,009,302 B2 * | 3/2006 | Tao | 257/777 |
| 7,327,004 B2 * | 2/2008 | Hattori et al. | 257/415 |
| 2003/0164529 A1 * | 9/2003 | Inoue et al. | 257/414 |

FOREIGN PATENT DOCUMENTS

JP A-11-008270 1/1999

* cited by examiner

*Primary Examiner*—Victor A Mandala
(74) *Attorney, Agent, or Firm*—Posz Law Group, PLC

(57) ABSTRACT

A sensor includes: a semiconductor chip having a sensing portion and a first bump; a circuit chip having a second bump; and a resin film having a groove. The semiconductor chip and the circuit chip are integrated with sandwiching the resin film therebetween. The resin film includes a first space and a second space before the first bump is bonded to the second bump. The first space faces the sensing portion. The second space is disposed on a periphery of the first space. The resin film expands when the first bump is bonded to the second bump. The second space accommodates an expanded portion of the resin film. The first space provides the groove after the first bump is bonded to the second bump.

10 Claims, 3 Drawing Sheets

PHYSICAL QUANTITY SENSOR, METHOD FOR MANUFACTURING THE SAME, AND RESIN FILM FOR BONDING SEMICONDUCTOR CHIP AND CIRCUIT CHIP

CROSS REFERENCE TO RELATED APPLICATION

This application is based on Japanese Patent Application No. 2006-82733 filed on Mar. 24, 2006, the disclosure of which is incorporated herein by reference.

FIELD OF THE INVENTION

The present invention relates to a physical quantity sensor, a method for manufacturing a physical quantity sensor, and a resin film for bonding a semiconductor chip and a circuit chip.

BACKGROUND OF THE INVENTION

In a physical quantity sensor, a semiconductor chip having a sensing portion for detecting a physical quantity such as angular speed, acceleration and pressure is electrically connected to a circuit chip. A method for connecting the semiconductor chip and the circuit chip is disclosed in, for example, JP-A-H11-8270. The method is to connect them by a flip-chip bonding method.

Specifically, the semiconductor chip has a pad made of aluminum disposed on one side of the chip and a first bump made of gold and disposed on a surface of the pad. The circuit chip has a second bump made of gold and disposed on one side of the chip. The semiconductor chip is bonded to the circuit chip in such a manner that the first bump faces and contacts the second bump. Thus, the sensor has a gap between the semiconductor chip and the circuit chip. Here, the flip-chip bonding process is performed by an ultrasonic bonding method.

In the above method, when the first bump is bonded to the second bump, an extra object may be generated, and attach to the sensing portion of the semiconductor chip. The sensing portion includes a movable portion, which is exposed on one side of the chip. Therefore, if the extra object adheres to the sensing portion, performance of the sensing portion is reduced.

To protect the sensing portion of the semiconductor chip, a resin film having adhesiveness covers the sensing portion. The resin film includes a groove facing the sensing portion so that the resin film does not contact the sensing portion. Thus, even when the resin film is attached to the semiconductor chip, the sensing portion does not contact the resin film.

When the semiconductor chip is bonded to the circuit chip through the resin film by the flip-chip bonding method, the resin film is heated in order to improve adhesiveness thereof, and then, the semiconductor chip is bonded to the circuit chip so that they are integrated. In this case, the bump of the semiconductor chip or the bump of the circuit chip pushes aside the resin film so that they are bonded directly.

However, since the resin film is heated, the resin film may be softened. Further, a compression stress is generated when the semiconductor chip is bonded to the circuit chip. Accordingly, the resin film may contact the sensing portion. When the resin film contacts the sensing portion, the performance of the sensing portion is reduced. Further, the stress from the resin film, which is expanded by heat, may be applied to the bump, so that the bonding strength between the bumps is reduced by stress application.

It is required for a sensor having a semiconductor chip and a circuit chip to prevent a resin film from adhering to a sensing portion of the semiconductor chip and to improve bonding strength between the semiconductor chip and the circuit chip.

SUMMARY OF THE INVENTION

In view of the above-described problem, it is an object of the present disclosure to provide a physical quantity sensor. It is another object of the present disclosure to provide a method for manufacturing a physical quantity sensor. It is further another object of the present disclosure to provide a resin film for bonding a semiconductor chip and a circuit chip.

According to a first aspect of the present disclosure, a sensor includes: a semiconductor chip having a sensing portion and a first bump, wherein the first bump surrounds the sensing portion; a circuit chip having a second bump facing the first bump; and a resin film having a groove facing the sensing portion, wherein the resin film is separated from the sensing portion. The semiconductor chip and the circuit chip are integrated with sandwiching the resin film therebetween. The resin film includes a first space and a second space before the first bump is bonded to the second bump. The first space faces the sensing portion. The second space is disposed on a periphery of the first space. The resin film is capable of being heated when the resin film is sandwiched between the semiconductor chip and the circuit chip. The resin film expands when the first bump is bonded to the second bump. The second space accommodates an expanded portion of the resin film. The first space provides the groove after the first bump is bonded to the second bump.

In the above sensor, since the second space accommodates the expanded resin film, the resin film does not contact and adhere to the sensing portion. Thus, the sensor performance is improved.

Alternatively, the resin film may further include a concavity before the first bump is bonded to the second bump, and the concavity accommodates the first bump when the resin film is sandwiched between the semiconductor chip and the circuit chip. In this case, the expanded resin film is accommodated in a clearance between the first and second bumps. Thus, a stress caused by the expanded resin film is not directly applied to the first and second bumps, so that bonding strength between the first and second bumps is improved.

According to a second aspect of the present disclosure, a method for manufacturing a sensor having a semiconductor chip, a resin film and a circuit chip includes: preparing the semiconductor chip having a sensing portion and a first bump, wherein the first bump surrounds the sensing portion; preparing the circuit chip having a second bump; preparing the resin film having a first space and a second space, wherein the second space is disposed on a periphery of the first space; sandwiching and heating the resin film between the semiconductor chip and the circuit chip in such a manner that the first bump faces the second bump and the first space faces the sensing portion; and press-bonding the semiconductor chip and the circuit chip with the resin film so that the first bump is bonded to the second bump. In the press-bonding, the second space accommodates an expanded portion of the resin film.

In the above method, since the second space accommodates the expanded resin film, the resin film does not contact and adhere to the sensing portion. Thus, the sensor performance is improved.

According to a third aspect of the present disclosure, a resin film for bonding a semiconductor chip and a circuit chip is provided. The semiconductor chip has a sensing portion and a first bump, and the circuit chip has a second bump. The resin film includes: a resin sheet; a first space disposed in the resin sheet; and a second space disposed in the resin sheet. The first space corresponds to the sensing portion, which is surrounded with the first bump. The second space is disposed on a periphery of the first space. The resin sheet is capable of being heated when the resin sheet is sandwiched between the semiconductor chip and the circuit chip. The second space accommodates an expanded portion of the resin sheet when the first bump is bonded to the second bump and the resin sheet expands. The first space provides a groove when the first bump is bonded to the second bump. The groove faces the sensing portion so that the resin sheet is separated from the sensing portion.

In the above resin film, since the second space accommodates the expanded resin film, the resin film does not contact and adhere to the sensing portion. Thus, the sensor performance is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
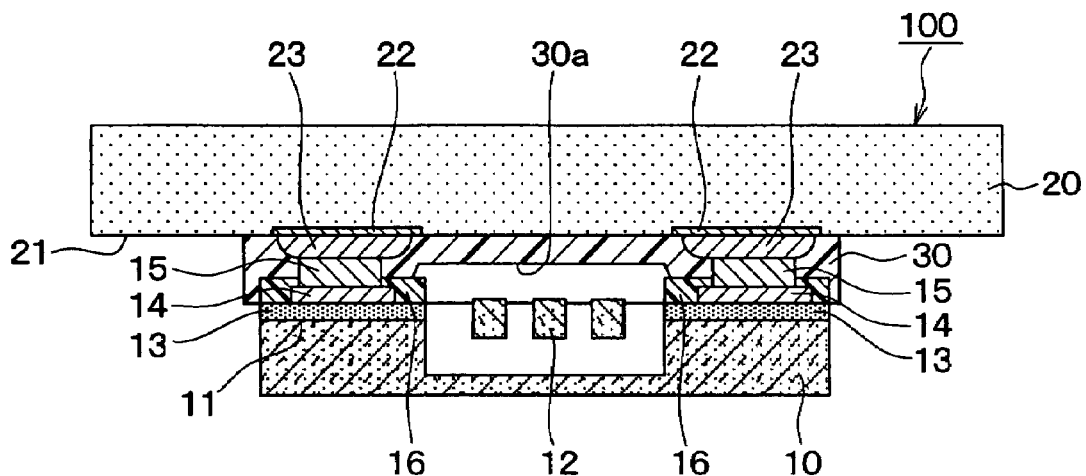
FIG. 1 is a cross sectional view showing a physical quantity sensor.

FIG. 1 shows a physical quantity sensor 100 having a semiconductor chip 10, a circuit chip 20 and a resin film 30.

The semiconductor chip 10 provides a vibrator 12 as a sensing portion for detecting a physical quantity such as an angular speed. The vibrator 12 as a movable portion is disposed on one side 11 of the semiconductor chip 10. The semiconductor chip 10 is formed from a silicon substrate, SOI substrate or the like by a semiconductor process.

The vibrator 12 has, for example, a comb-teeth structure, so that the comb-teeth structure is movably supported with a beam having elasticity. The comb-teeth structure is displaced according to the physical quantity applied to the sensor. The physical quantity such as the angular speed is detected by measuring a capacitance between a detection electrode and the vibrator 12.

A silicon oxide insulation layer 13 as an interlayer insulation film is formed on the one side 11 of the semiconductor chip 10. The insulation layer 13 is made of silicon oxide or silicon oxide with other elements. For example, the insulation layer 13 is made of BPSG.

A pad 14 for inputting and outputting a signal or applying a voltage to the vibrator 12 is formed on the insulation layer 13. The pad 14 is made of, for example, aluminum or aluminum including material. Preferably, the aluminum including material includes 90% of aluminum. Specifically, the pad 14 may be made of Al—Si—Cu alloy, which includes 99% or more aluminum, silicon and copper.

A first bump 15 made of mainly gold is formed on the pad 14. The first bump 15 is made of, for example, pure gold or 99% gold. The first bump 15 is formed on the pad 14 by a wire bonding method, a conventional stud bump forming method, a screen printing method by using a conductive paste such as gold paste, an ink jet method by using a paste such as gold paste, or the like.

A protection film 16 is formed on a part of the one side 11 of the semiconductor chip 10 other than the pad 14. The protection film 16 is made of silicon nitride, poly imide or the like. The protection film 16 covers and protects the part of the one side 11 of the semiconductor chip 10.

The circuit chip 20 includes a control circuit and the like so that the circuit chip 20 operates the semiconductor chip 10, inputs and processes a signal from the semiconductor chip 10, and outputs a detected signal to an external circuit. The circuit chip 20 is formed from a silicon substrate or the like by using a conventional semiconductor process such as a MOS transistor process and a bipolar transistor process. Thus, the circuit chip 20 includes an IC chip and a flip-chip.

Another pad 22 electrically connecting to the control circuit is formed on one side 21 of the circuit chip 20. A second bump 23 made of mainly gold is formed on the pad 22. The second bump 23 is made of pure gold or 99% gold, and formed by a conventional bump forming method.

Figure 4:
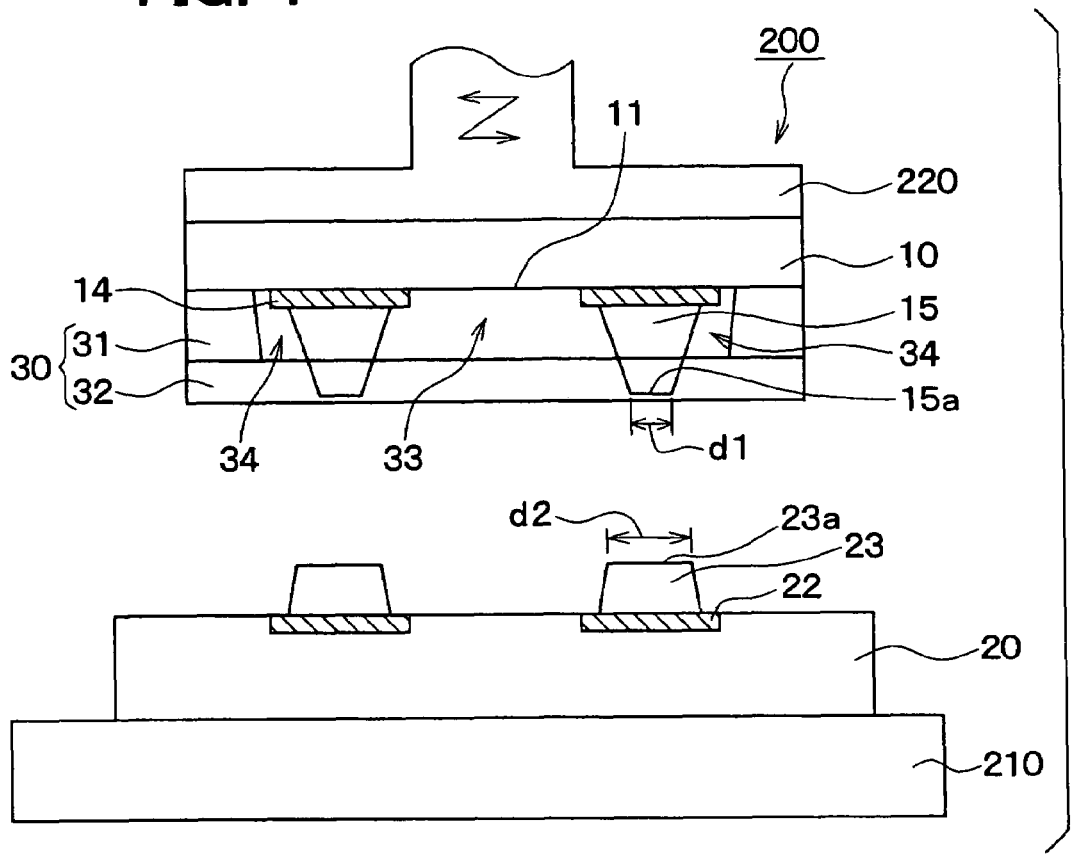
FIG. 4 is a cross sectional view showing an ultrasonic bonding device.

Before the semiconductor chip 10 is bonded to the circuit chip 20, a contact area 23a of the second bump 23 is larger than a top area 15a of the first bump 15, as shown in FIG. 4. Here, the contact area 23a of the second bump 23 contacts the top area 15a of the first bump 15 after the semiconductor chip 10 is bonded to the circuit chip 20. Preferably, the contact area 23a of the second bump 23 is equal to or larger than 1.4 times the top area 15a of the first bump 15.

A diameter d1 of the top area 15a of the first bump 15 is, for example, 60 μm. A diameter d2 of the contact area 23a of the second bump 23 is, for example, equal to or larger than 70 μm.

As shown in FIG. 1, the one side 11 of the semiconductor chip 10 faces the one side 21 of the circuit chip 20. The first bump 15 is bonded to the second bump 23 by an ultrasonic bonding method or the like so that they are bonded with metallic bonding. Thus, the semiconductor chip 10 and the circuit chip 20 are electrically and mechanically bonded each other through the first and second bumps 15, 23. The semiconductor chip 10 and the circuit chip 20 have a distance therebetween, which is provided by the first and second bumps 15, 23, so that the vibrator 12 is apart from the circuit chip 20. Further, an electric signal from the semiconductor chip 10 is outputted to the circuit chip 20 through the bumps 15, 23. For example, the electric signal is converted to a voltage signal by using a C-V converting circuit in the circuit chip 20. Thus, the voltage signal as an angular speed signal is outputted from the sensor 100 to an external circuit.

A resin film 30 protects the vibrator on the semiconductor chip 10. The resin film 30 is disposed between the circuit chip 20 and the semiconductor chip 10. The resin film 30 has a groove 30a corresponding to the vibrator 12 in the semiconductor chip 10. The vibrator 12 is separated from the resin film 30 by the groove 30a.

The resin film 30 is made of, for example, non-conductive resin material having adhesiveness such as NCF (i.e., non-conductive film). The resin film 30 is press-bonded to the one side 21 of the circuit chip 20 so that the resin film 30 covers the second bump 23.

Figure 3:
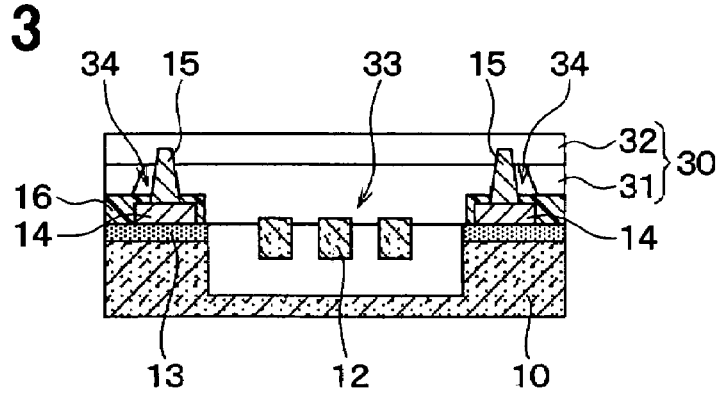
FIG. 3 is a cross sectional view showing the semiconductor chip taken along line III-III in FIG. 2.

The resin film 30 is made of, for example, electric insulating resin such as epoxy resin, silicon resin and poly imide resin. In this case, the resin film 30 is softened by heating the film 30. When the resin film 30 is further heated after the resin film 30 is softened, the softened resin film 30 is hardened. In FIG. 1, the resin film 30 includes a first resin layer 31 and a second resin layer 32, as shown in FIG. 3. The first resin layer 31 contacts the semiconductor chip 10, and the second resin layer 32 contacts the circuit chip 20.

The resin film 30 has an original shape before the semiconductor chip 10 is bonded to the circuit chip 20, and has a deformed shape after the semiconductor chip 10 is bonded to the circuit chip 20. The original shape of the resin film 30 is different from the deformed shape. Specifically, when the semiconductor chip 10 is bonded to the circuit chip 20, the resin film 30 expands by heat, and then, the resin film 30 has the deformed shape shown in FIG. 1 after the semiconductor chip 10 is bonded to the circuit chip 20. The original shape of the resin film 30 has a first space 33 and a second space 34 for accommodating an expanded part of the resin film 30 after the semiconductor chip 10 is bonded to the circuit chip 20. After the semiconductor chip 10 is bonded to the circuit chip 20, the second space 34 is filled with the expanded resin film 30, so that the semiconductor chip 10 is bonded to the circuit chip 20.

The first space 33 and the second space 34 are disposed in the first resin layer 31. When the resin film 30 is sandwiched between the semiconductor chip 10 and the circuit chip 20 so that they are integrated, the first and second spaces 33, 34 accommodate the expanded portion of the resin film 30. FIG. 1 shows the sensor, in which the second space is filled with the expanded resin film 30.

A manufacturing method of the sensor 100 is described as follows. Firstly, a silicon wafer including a silicon substrate having a plurality of vibrators 12 is prepared. In a wafer process, the pad 14 made of aluminum and having a film thickness of, for example, 0.7 µm is formed on the wafer by a photolithography method and a sputtering method. Further, the protection film 16 is formed on the wafer other than the vibrators 12.

Next, the first bump 15 is formed on the surface of the pad 14. Specifically, a gold wire is bonded to the pad 14 by a wire bonding method so that the first bump 15 is formed on the pad 14.

After the first bump 15 is formed, a plate press-contacts the top of the first bump 15 so that a predetermined force is applied to the top of the first bump 15. Thus, the top of the first bump 15 is plastically deformed so that the top of the first bump 15 is flattened. This process is a leveling process. This flattened top of the first bump 15 provides a top area 15a of the first bump 15, which contacts the contact area 23a of the second bump 23. In this embodiment, the diameter d1 of the top area 15a of the first bump 15 is, for example, 60 µm. The first bump 15 has a truncated cone shape, so that a diameter of the first bump 15 becomes smaller as it goes to the top area 15a. The height of the first bump is a few tens microns.

The resin film 30 is formed on the semiconductor chip 10 in order to protect the vibrator 12 from an extra object. Specifically, the first resin film 31 and the second resin film 32 having adhesiveness are prepared. The first and second spaces 33, 34 are formed in the first resin film 31 by a punching method with a mold or a laser beam processing method. The first and second spaces 33, 34 penetrate the first resin film 31.

In this embodiment, the first space in the first resin film 31 is to face the vibrator 12 of the semiconductor chip 10, and the second space 34 surrounds the first space 33.

The first resin film 31 having the first and second spaces 33, 34 and the second resin film 32 having no space are bonded each other so that the resin film 30 is formed. Thus, the resin film 30 provides an integrated one film having the first and second spaces 33, 34.

The first resin film 31 in the resin film 30 is bonded to one side of the wafer, on which the vibrator 12 is formed. Then, the wafer is cut into multiple semiconductor chips 10. Thus, the semiconductor chip 10 is prepared, as shown in FIGS. 2 and 3.

The first resin film 31 on the one side 11 of the semiconductor chip 10 has the first and second spaces 33, 34. Before the semiconductor chip 10 is bonded to the circuit chip 20, the resin film 30 does not contact the vibrator 12 and the first bump 15 by using the first and second spaces 33, 34.

Each space 33, 34 functions as a spacer to prevent the expanded first and second resin films 31, 32 from contacting the vibrator 12 and the first bump 15 when the resin film 30 is bonded to the semiconductor chip 10, and the semiconductor chip 10 with the resin film 30 is bonded to the circuit chip 20. Specifically, the second space 34 is filled with the expanded resin film 30.

Figure 2:
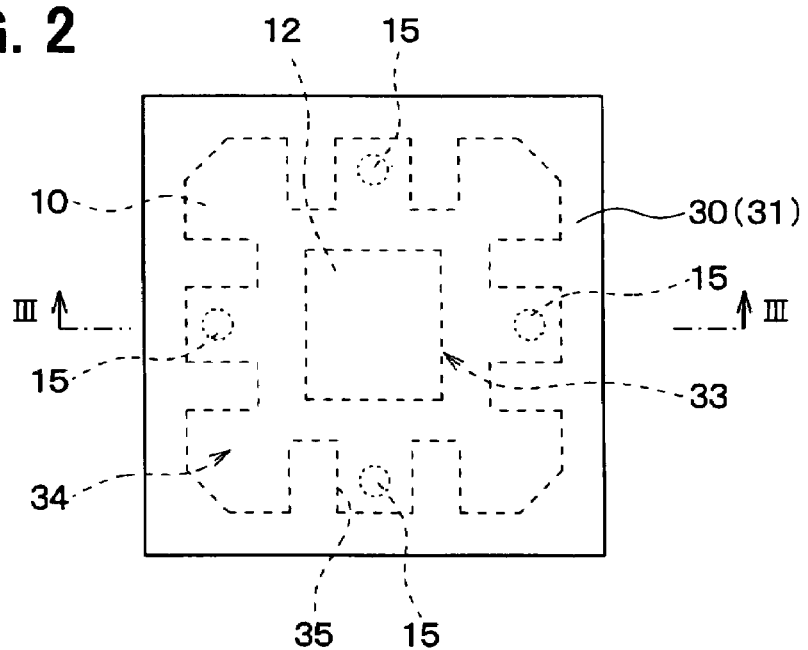
FIG. 2 is a plan view showing a semiconductor chip with a resin film thereon in the sensor.

As shown in FIG. 2, the first resin film 31 further includes a concavity 35 corresponding to the first bump 15. The first bump 15 is accommodated in the concavity 35 when the resin film 30 is sandwiched between the semiconductor chip 10 and the circuit chip 20. Thus, the first bump 15 in the concavity 35 does not contact the resin film 30 before the semiconductor chip 10 is bonded to the circuit chip 20. Thus, the semiconductor chip 10 with the resin film 30 is prepared.

Another wafer having a control circuit and the like is prepared. The pad 22 made of aluminum is formed on the wafer. Further, the second bump 23 made of gold is formed on the pad 22. Specifically, the second bump 23 is formed on a part of the pad, which facing the first bump 15 of the semiconductor chip 10.

Then, the top of the second bump 23 is also flattened, i.e., the leveling process is performed. Thus, the top area 23a of the second bump 23 and the top area 15a of the first bump 15 are flattened, so that a stress concentration at the top of the first bump 15 and the top of the second bump 23 is reduced. Accordingly, damage of each chip 10, 20 is also reduced.

The diameter d2 of the contact area 23a of the second bump 23 is, for example, 70 µm. Thus, the contact area 23a is equal to or larger than 1.4 times the top area 15a. The shape and the height of the second bump 23 are the same as the first bump 15. The wafer is cut into multiple circuit chip 20 by a wafer dicing method.

The relationship between the top area 15a and the contact area 23a is determined as follows. The circuit chip 20 having the diameter d2 of the contact area 23a, which is 60 µm, 70 µm, 80 µm or 90 µm, is prepared. The semiconduc diameter d1 of the top area 15a of 60 µm is also prepared. After the first bump 15 and the second bump 23 are bonded to each other by an ultrasonic bonding method, damage occurrence rate in each bump 15, 23 is determined.

Specifically, after the first bump 15 is bonded to the second bump 23, the sensor 100 is dipped in a hydrochloric acid solution at room temperature. Here, the hydrochloric acid solution has a 35% hydrochloric acid. Thus, the pad 22 in the circuit chip 20 is etched, so that a base substrate is exposed in order to observe the base substrate by using a microscope. Thus, the semiconductor chip and the circuit chip are investigated. When a crack is observed in the circuit chip 20, or when a fringe pattern caused by a distortion of the circuit chip 20 is observed, detection of damage is defined. Thus, multiple samples of the sensor 100 are investigated, so that a ratio of the samples, at which the damage occurs, is defined as a damage occurrence ratio.

In this embodiment, a condition of ultrasonic bonding method is such that an amplitude is 2.8 µm, an oscillation time is 0.3 seconds, a peak load is 4 Newtons per 4 bumps, and a tool and stage temperature is 150° C. Alternatively, another condition may be performed.

When the diameter d2 of the contact area 23a is equal to or larger than 70 μm, the damage occurrence ratio is substantially zero. Accordingly, when the diameter d2 of the contact area 23a is larger than the diameter d1 of the top area 15a, the damage occurrence ratio of the circuit chip 20 is effectively reduced. This is because the load applied to the second bump 23 is dispersed in a case where the diameter d2 is larger than the diameter d1. Thus, the stress to the circuit chip 20, which is disposed under the pad 22, is reduced. When the diameter d2 is 70 μm, and the diameter d1 is 60 μm, the ratio between the contact area 23a and the top area 15a is almost 1.36. Thus, it is preferred that the contact area 23a is equal to or larger than 1.4 times the top area 15a.

Since the contact area 23a is larger than the top area 15a, positioning of the first and second bumps 15, 23 is easily performed so that positioning error is reduced.

Next, the first bump 15 of the semiconductor chip 10 is bonded to the second bump 23 of the circuit chip 20 by using an ultrasonic bonding device. FIG. 4 shows the ultrasonic bonding device 200. The device 200 includes a stage 210 for fixing the circuit chip 20, a tool for fixing the semiconductor chip 10, and a driving circuit (not shown) for vibrating the tool 220 with ultrasonic wave. In FIG. 4, the sensing portion and the protection film 16 of the semiconductor chip 10 are not shown.

In the device 200, the temperature of the stage 210 and the temperature of the tool 220 are controllable. The semiconductor chip 10 is supported on the tool 220 by vacuum contact method or the like. Further, the tool 220 applies a predetermined load to the stage 210. Thus, the tool 220 supporting the semiconductor chip 10 and applying the load to the stage 210 vibrates with ultrasonic wave.

As shown in FIG. 4, the stage 210 and the tool 220 are arranged appropriately so that the one side 11 of the semiconductor chip 10 first bump 15, on which the first bump 15 is formed, faces the one side 21 of the circuit chip 20, on which the second bump 23 is formed.

The resin film 30 is heated by the stage 210 and the tool 220 through the semiconductor chip 10 and the circuit chip 20, so that the resin film 30 is softened. Further, the first bump 15 press-contacts the second bump 23 by using the tool 220.

Then, the semiconductor chip 10 and the circuit chip 20 are heated, and the ultrasonic wave is applied to the semiconductor chip 10 so that the first bump 15 is bonded to the second bump 23.

Thus, the resin film 30 is heated and softened so that the semiconductor chip 10 is bonded to the circuit chip 20. Further, the first bump 15 is bonded to the second bump 23 with the ultrasonic bonding method. In this case, the resin film 30 is expanded so that the volume of the resin film 30 increases.

Figure 5:
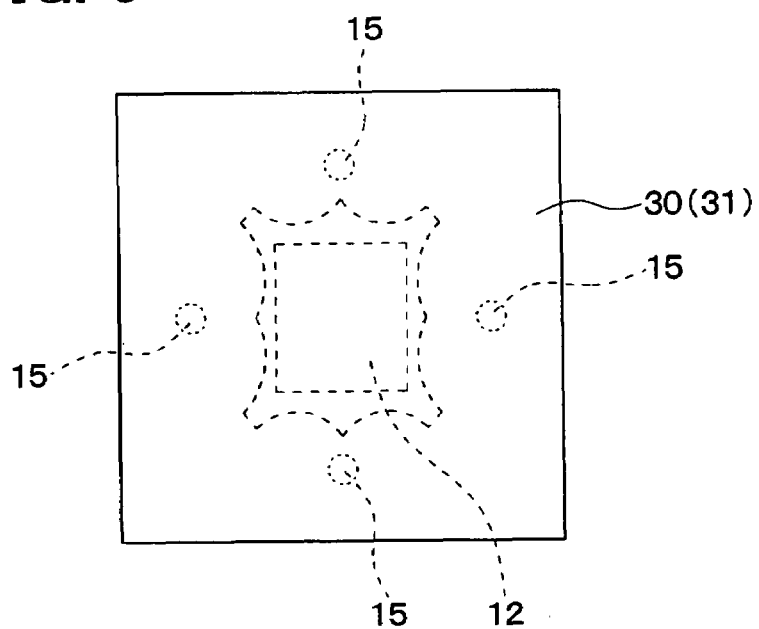
FIG. 5 is a plan view showing the sensor after ultrasonic bonding.

FIG. 5 shows the sensor 100 after the semiconductor chip 10 is bonded to the circuit chip 23. Specifically, FIG. 5 is a plan view of the resin film 30 seeing from the circuit chip side. In FIG. 5, the second space 34 in the first resin film 31 is filled with the expanded resin film 30 after the first bump 15 is bonded to the second bump 23.

Further, the first space 33 is deformed by expansion of the second resin film 32 so that the groove 30a of the resin film 30 is formed. The resin film 30 does not contact the vibrator 12, so that the resin film 30 does not contact and adheres to the vibrator 12 as the sensing portion of the semiconductor chip 10.

As shown in FIG. 2, the concavity 35 is formed in the first resin film 31 not to contact the first resin film 31 and the first bump 15 before the first bump 15 is bonded to the second bump 23. The concavity 35 provides a clearance between the first resin film 31 and the first bump 15. Thus, before the first bump 15 is bonded to the second bump 23, the resin film 30 does not contact the first and second bumps 15, 23. In a case where the first bump 15 is bonded to the second bump 23, the expanded resin film 30 is inserted into the clearance even when the resin film 30 expands. Thus, the stress caused by the expanded resin film 30 is not directly applied to the first and second bumps 15, 23. Thus, the stress is reduced by using the clearance; therefore, the bonding strength between the first and second bumps 15, 23 is improved. Thus, the sensor 100 is completed.

In the method for manufacturing the sensor 100, the first and second spaces 33, 34 are preliminarily formed in the resin film 30. When the first bump 15 is bonded to the second bump 23, the expanded resin film 30 is accommodated in the second space 34. Thus, the resin film 30 expands to fill in the second space 34, so that the expanded resin film 30 does not contact the vibrator 12. Accordingly, the resin film 30 is prevented from adhering to the vibrator 12 as the sensing portion of the semiconductor chip 10.

Even when the resin film 30 expands, the expanded resin film 30 penetrates into the concavity 35 in the first resin film 31 and the clearance between the first bump 15 and the second bump 23. Thus, the stress caused by the expanded resin film 30 is not directly applied to the first and second bumps 15, 23. Thus, the bonding strength between the first and second bumps 15, 23 is not reduced.

Figure 6:
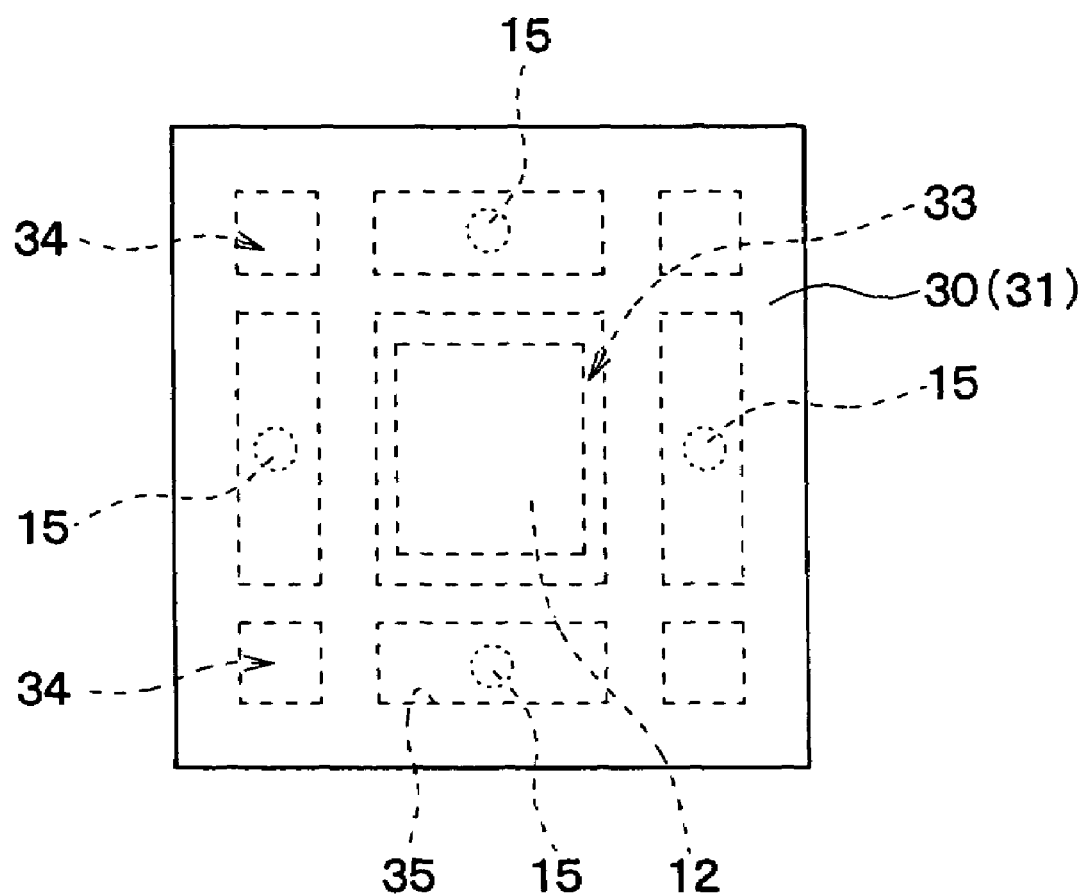
FIG. 6 is a plan view showing another physical quantity sensor.

FIG. 6 shows another resin film 30 bonded to the semiconductor chip 10. The center of the first resin film 31 has a striped through hole so that the second space 34 is formed. Specifically, the striped through hole provides the second space 34. In this case, the resin film 30 is prevented from adhering to the vibrator 12 as the sensing portion of the semiconductor chip 10.

The resin film 30 includes the first resin film 31 having a through hole, which is punched, and the second resin film 32 having a sheet shape. The first and second resin films 31, 32 are stacked. Alternatively, one sheet of resin film is prepared, and then, one side of the sheet is trimmed so that the first and second spaces 33, 34 are formed. Alternatively, the resin film 30 may have three or more resin sheets, which are stacked.

The first and second spaces 33, 34 may have other shapes as long as the expanded resin film 30 is accommodated in the first and second spaces 33, 34.

The sensing portion detects acceleration. Alternatively, the sensing portion may detect another physical quantity.

In FIG. 2, the first space 33 is connected to the second space 34. In FIG. 6, the first space 33 is separated from the second space 34. Alternatively, a part of the second space 34 may be connected to the first space 33, and the other part of the second space 34 may be separated from the first space 33.

In the above embodiments, the first bump 15 dopes not contact the resin film 30 by using the concavity 35 before the semiconductor chip 10 is bonded to the circuit chip 20. Alternatively, a part of the first bump 15 may contact the resin film 30 before the semiconductor chip 10 is bonded to the circuit chip 20. Specifically, the part of the first bump may contact the inner wall of the concavity 35.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A sensor comprising:
   a semiconductor chip having a sensing portion and a first bump, wherein the first bump surrounds the sensing portion;
   a circuit chip having a second bump facing the first bump; and
   a resin film having a groove facing the sensing portion, wherein the resin film is separated from the sensing portion, wherein
   the semiconductor chip and the circuit chip are integrated with sandwiching the resin film therebetween,
   the resin film includes a first space and a second space before the first bump is bonded to the second bump,
   the first space faces the sensing portion,
   the second space is disposed on a periphery of the first space,
   the resin film is capable of being heated when the resin film is sandwiched between the semiconductor chip and the circuit chip,
   the resin film expands when the first bump is bonded to the second bump,
   the second space accommodates an expanded portion of the resin film, and
   the first space provides the groove after the first bump is bonded to the second bump.

2. The sensor according to claim 1, wherein
   the resin film further includes a concavity before the first bump is bonded to the second bump, and
   the concavity accommodates the first bump when the resin film is sandwiched between the semiconductor chip and the circuit chip.

3. The sensor according to claim 1, wherein
   the resin film further includes a first resin sheet and a second resin sheet before the first bump is bonded to the second bump,
   the first space and the second space are disposed in the first resin sheet, and
   the first resin sheet and the second resin sheet are stacked to provide the resin film.

4. The sensor according to claim 1, wherein
   the first bump has a top area, and the second bump has a contact area,
   the top area contacts the contact area, and
   each of the top area and the contact area is flat before the first bump is bonded to the second bump.

5. The sensor according to claim 4, wherein
   the contact area is larger than the top area before the first bump is bonded to the second bump.

6. The sensor according to claim 5, wherein
   the contact area is equal to or larger than 1.4 times the top area before the first bump is bonded to the second bump.

7. A method for manufacturing a sensor having a semiconductor chip, a resin film and a circuit chip, the method comprising:
   preparing the semiconductor chip having a sensing portion and a first bump, wherein the first bump surrounds the sensing portion;
   preparing the circuit chip having a second bump;
   preparing the resin film having a first space and a second space, wherein the second space is disposed on a periphery of the first space;
   sandwiching and heating the resin film between the semiconductor chip and the circuit chip in such a manner that the first bump faces the second bump and the first space faces the sensing portion; and
   press-bonding the semiconductor chip and the circuit chip with the resin film so that the first bump is bonded to the second bump, wherein
   in the press-bonding, the second space accommodates an expanded portion of the resin film.

8. The method according to claim 7, wherein
   in the preparing the resin film, a concavity is formed in the resin film,
   the concavity corresponds to the first bump, and
   in the sandwiching and heating, the first bump is accommodated in the concavity of the resin film.

9. A resin film for bonding a semiconductor chip and a circuit chip, the semiconductor chip having a sensing portion and a first bump, and the circuit chip having a second bump, the resin film comprising:
   a resin sheet;
   a first space disposed in the resin sheet; and
   a second space disposed in the resin sheet, wherein
   the first space corresponds to the sensing portion, which is surrounded with the first bump,
   the second space is disposed on a periphery of the first space,
   the resin sheet is capable of being heated when the resin sheet is sandwiched between the semiconductor chip and the circuit chip,
   the second space accommodates an expanded portion of the resin sheet when the first bump is bonded to the second bump and the resin sheet expands,
   the first space provides a groove when the first bump is bonded to the second bump, and
   the groove faces the sensing portion so that the resin sheet is separated from the sensing portion.

10. The resin film according to claim 9, further comprising:
    a concavity for accommodating the first bump when the resin sheet is sandwiched between the semiconductor chip and the circuit chip, wherein
    the resin sheet includes a first resin layer and a second resin layer,
    the first space and the second space are disposed in the first resin layer,
    the second resin layer is a sheet, and
    the first resin layer and the second resin layer are stacked to provide the resin sheet.

* * * * *